United States Patent
Kawashima et al.

(10) Patent No.: US 8,546,197 B2
(45) Date of Patent: Oct. 1, 2013

(54) THIN FILM TRANSISTOR, METHOD OF MANUFACTURING THE SAME, AND ELECTRONIC DEVICE

(75) Inventors: Noriyuki Kawashima, Kanagawa (JP); Hidehisa Murase, Kanagawa (JP); Mao Katsuhara, Kanagawa (JP)

(73) Assignee: Sony Corporation, Tokyo (JP)

( * ) Notice: Subject to any disclaimer, the term of this patent is extended or adjusted under 35 U.S.C. 154(b) by 118 days.

(21) Appl. No.: 13/106,278

(22) Filed: May 12, 2011

(65) Prior Publication Data

US 2011/0297938 A1  Dec. 8, 2011

(30) Foreign Application Priority Data

May 26, 2010  (JP) ................ P2010-120176

(51) Int. Cl.
*H01L 21/00* (2006.01)
(52) U.S. Cl.
USPC ............ 438/149; 438/158; 438/164; 257/57; 257/223; 257/66; 257/E21.414; 257/E29.273
(58) Field of Classification Search
USPC ............. 257/40, 98, 642–643, 759, E39.007, 257/E51.001–E51.052, E27.117–E27.119
See application file for complete search history.

(56) References Cited

U.S. PATENT DOCUMENTS

| 6,344,660 | B1 * | 2/2002 | Dimitrakopoulos et al. .... 257/40 |
| 2004/0104461 | A1 | 6/2004 | Ishihara et al. |
| 2006/0022194 | A1 * | 2/2006 | Nagayama ............. 257/40 |
| 2006/0097254 | A1 | 5/2006 | Ahn et al. |
| 2007/0131926 | A1 * | 6/2007 | Lee et al. ................ 257/40 |
| 2008/0188092 | A1 | 8/2008 | Cain et al. |
| 2008/0241990 | A1 * | 10/2008 | Kim et al. .............. 438/99 |
| 2009/0170291 | A1 | 7/2009 | Ahn et al. |
| 2010/0090204 | A1 * | 4/2010 | Chuman et al. ............ 257/40 |

FOREIGN PATENT DOCUMENTS

| JP | 2000-269504 | 9/2000 |
| JP | 2005-079225 | 3/2005 |
| JP | 2006-140433 | 6/2006 |
| JP | 2006-261312 | 9/2006 |
| JP | 2006-332661 | 12/2006 |
| JP | 2007-165834 | 6/2007 |
| JP | 2008-524839 | 7/2008 |

* cited by examiner

*Primary Examiner* — Mamadou Diallo
(74) *Attorney, Agent, or Firm* — Dentons US LLP (57) ABSTRACT

A method of manufacturing a thin film transistor includes: forming a gate electrode on a substrate; forming a gate insulating layer on the gate electrode; forming an organic semiconductor layer on the gate insulating layer; forming an organic semiconductor pattern by selectively removing part of the organic semiconductor layer by means of a laser ablation method; and forming source and drain electrodes on the organic semiconductor pattern.

6 Claims, 5 Drawing Sheets

THIN FILM TRANSISTOR, METHOD OF MANUFACTURING THE SAME, AND ELECTRONIC DEVICE

BACKGROUND

The present technology relates to a thin film transistor having an organic semiconductor pattern, a method of manufacturing the same, and an electronic device using the thin film transistor.

In recent years, attention has been drawn to an organic thin film transistor which is a thin film transistor (hereinafter referred to as "TFTs") including a channel layer made of an organic semiconductor material. All layers including the channel layer can be formed by coating or by printing so that a low-cost manufacturing can be achieved. Also, the channel layer can be formed at a lower temperature as compared to a method such as an evaporation method, so that the organic TFT can be mounted on a plastic film having a low heat resistance and flexibility.

The use of an organic TFT as a switching element for an electronic device such as a display device has been studied, as in an inorganic TFT including a channel layer made of an inorganic semiconductor material. The organic TFT includes: an organic semiconductor pattern which forms a channel layer; and source and drain electrodes connected to the organic semiconductor pattern.

When manufacturing the organic TFT, a process step is desired where an organic semiconductor layer is formed and the organic semiconductor layer is then selectively removed (patterned) to form an organic semiconductor pattern, in order to reduce an OFF state current. This process is, in general, called element isolation. In the process of manufacturing the organic TFT, unlike the process of manufacturing the inorganic TFT, the organic semiconductor pattern is readily dissolved in an organic solvent and there may be difficulties in performing the element isolation with the photolithography method that utilizes the organic solvent.

Several methods have been proposed for the element isolation. The methods are specifically described below. The YAG laser or the like is irradiated to a part of an organic semiconductor layer to sublimate unnecessary part (for example, see Japanese Patent Application Laid-Open Publication No. 2005-079225). A patterned insulating layer (such as silicon nitride) is formed on each of source and drain electrodes respectively, and then an organic semiconductor layer is formed. In this case, the organic semiconductor layer is isolated by utilizing a height difference (step difference) between a region where the patterned insulating layer is formed and a region where the patterned insulating layer is not formed (for example, see Japanese Patent Application Laid-Open Publication No. 2000-269504). A patterned layer (such as polyvinyl alcohol) is formed on an organic semiconductor layer and the organic semiconductor layer is then etched using the patterned layer as an etch mask (for example, see Japanese Patent Application Laid-Open Publication No. 2006-261312). An organic semiconductor layer and a gate insulating layer are formed in this order on source and drain electrodes and then both of the organic semiconductor layer and the gate insulating layer are patterned simultaneously using a laser ablation method (for example, see Japanese Patent No. 4137915). An organic semiconductor layer and a protection layer (such as silicon oxide) are formed in this order on source and drain electrodes and then both of the organic semiconductor layer and the protection layer are patterned simultaneously using the laser ablation method (for example, see Japanese Patent Application Laid-Open Publication No. 2006-332661). An organic semiconductor layer is formed on source and drain electrodes, and then a laser beam is irradiated onto regions other than the regions on which both the electrodes are not formed to pattern the organic semiconductor layer (for example, see Japanese Patent Application Laid-Open Publication No. 2008-524839 (Translation of PCT Application)). A protection layer (such as indium tin oxide (ITO)) and an organic semiconductor layer are formed in this order on source and drain electrodes, and then a laser beam is irradiated onto a region on which the protection layer is formed to pattern the organic semiconductor layer (for example, see Japanese Patent Application Laid-Open Publication No. 2007-165834).

SUMMARY

Organic TFTs are, as well as inorganic TFTs, classified into a top-contact type and a bottom-contact type in accordance with positional relationships between an organic semiconductor pattern and a source electrode and the organic semiconductor pattern and a drain electrode. In particular, the top-contact organic TFT is considered to be promising, in which source and drain electrodes are so contacted as to be overlapped on an upper side of an organic semiconductor pattern. One reason is that a contact resistance between the organic semiconductor pattern and the source electrode and that between the organic semiconductor pattern and the drain electrode are reduced, and a heat resistance is improved.

However, no specific proposal has been made yet as to a practical method of manufacturing the top-contact organic TFT, and thus there is a demand of establishing the practical method of manufacturing the top-contact organic TFT. In this case, in order to ensure the performance and productivity of an electronic device having the organic TFT, it is desirable that not only the top-contact organic TFT be merely manufactured but also the organic TFT having a high-performance be easily manufactured.

It is desirable to provide a thin film transistor and a manufacturing method capable of achieving higher performance and easier manufacturing, and an electronic device.

A method of manufacturing a thin film transistor according to an embodiment of the present technology includes: forming a gate electrode on a substrate; forming a gate insulating layer on the gate electrode; forming an organic semiconductor layer on the gate insulating layer; forming an organic semiconductor pattern by selectively removing part of the organic semiconductor layer by means of a laser ablation method; and forming source and drain electrodes on the organic semiconductor pattern.

A thin film transistor according to an embodiment of the present technology includes: a substrate; a gate electrode formed on the substrate; a gate insulating layer formed on the gate electrode; an organic semiconductor pattern formed on the gate insulating layer by means of a laser ablation method; and source and drain electrodes formed on the organic semiconductor pattern.

An electronic device according to an embodiment of the present technology includes a thin film transistor, in which the thin film transistor includes: a substrate; a gate electrode formed on the substrate; a gate insulating layer formed on the gate electrode; an organic semiconductor pattern formed on the gate insulating layer by means of a laser ablation method; and source and drain electrodes formed on the organic semiconductor pattern.

According to the method of manufacturing the thin film transistor, the thin film transistor, the thin film transistor, and the electronic device of the embodiments of the present technology, the organic semiconductor pattern is formed by selectively removing part of the organic semiconductor layer by means of the laser ablation method, and the source and the drain electrodes are formed on the organic semiconductor pattern. Thus, the top-contact thin film transistor, which is low in resistance, is easily and stably manufactured. Therefore, it is possible to achieve higher performance and easier manufacturing of the thin film transistor.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION OF THE PREFERRED EMBODIMENTS

Embodiments of the present technology will now be described in details with reference to the attached drawings. The embodiments are described in the order as below.
1. Thin Film Transistor
1-1. Configuration of Thin Film Transistor
1-2. Method of Manufacturing Thin Film Transistor
2. Application Example of Thin Film Transistor (Electronic Device)
[1. Thin Film Transistor]
[1-1. Configuration of Thin Film Transistor]

Figure 1:
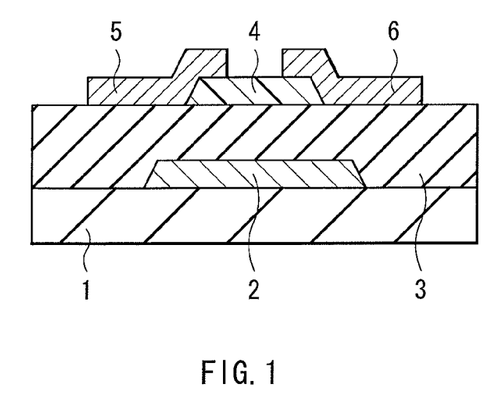
FIG. 1 is a cross-sectional view showing a configuration of a thin film transistor according to an embodiment of the present technology.

FIG. 1 shows the cross-sectional configuration of an organic TFT which is a thin film transistor according to an embodiment of the present technology.

The organic TFT has a configuration in which a gate electrode 2, a gate insulating layer 3, an organic semiconductor pattern 4, a source electrode 5, and a drain electrode 6 are formed in this order on a support substrate 1. The organic TFT described herein is of a bottom-gate-top-contact type in which the gate electrode 2 is located on a lower side of the organic semiconductor pattern 4, and the source and drain electrodes 5 and 6 are overlapped on an upper side of the organic semiconductor pattern 4. "The downside" described herein refers to a side of the organic semiconductor pattern 4 close to the support substrate 1, and "the upper side" refers to a side of the organic semiconductor pattern 4 away from the support substrate 1.

The support substrate 1 is made of any one or more kinds of materials such as a plastic material, a metal material, and an inorganic material.

The plastic material includes, for example, polymethyl methacrylate (PMMA), polyvinyl alcohol (PVA), polyvinylphenol (PVP), polyethersulfone (PES), polycarbonate (PC), polyimide (PI), polyethylene terephthalate (PET), polyethylene naphthalate (PEN), polyether ether ketone (PEEK), polyacrylate (PAR), polyphenylene sulfide (PPS), triacetylcellulose (TAC), or the like. The metal material includes, for example, aluminium (Al), nickel (Ni), stainless steel, or the like. The inorganic material includes, for example, silicon (Si), silicon oxide ($SiO_x$), silicon nitride ($SiN_x$), aluminium oxide ($AlO_x$), or other metallic oxide. The silicon oxide ($SiO_x$) includes, for example, glass, quartz, spin-on-glass, or the like.

The support substrate 1 may be a substrate having rigidity such as a wafer, or may be a film or a foil having flexibility. A surface of the support substrate 1 may be provided with a coating layer having a specific function. The coating layer may be a buffer layer for providing a reliable adherence, a gas barrier layer for preventing gas discharge, or the like, for example.

The support substrate 1 may have a single-layer structure or a multi-layer structure. When employing the multi-layer structure, two or more layers made of the above materials may be stacked. The same is true for the gate electrode 2, the gate insulating layer 3, the organic semiconductor pattern 4, the source electrode 5, and the drain electrode 6.

The gate electrode 2 is made of any of one or two or more kinds of materials such as a metal material, an inorganic conductive material, an organic conductive material, and a carbon material.

The metal material includes, for example, aluminum, copper (Cu), molybdenum (Mo), titanium (Ti), chromium (Cr), nickel, palladium (Pd), gold (Au), silver (Ag), platinum (Pt), tungsten (W), tantalum (Ta), an alloy containing the above metals, or the like. The inorganic conductive material includes, for example, indium oxide ($In_2O_3$), indium tin oxide (ITO), indium zinc oxide (IZO), zinc oxide (ZnO), or the like. The organic conductive material includes, for example, polyethylenedioxy thiophene (PEDOT), polystyrene sulfonate (PSS), polyaniline (PANI), or the like. The carbon material includes, for example, graphite, or the like. The gate electrode 2 may have a multi-layer structure including PEDOT/PSS or the like.

The gate insulating layer 3 is made of any one or more kinds of materials such as an inorganic insulating material and an organic insulating material. The inorganic insulating material includes, for example, silicon oxide, silicon nitride, aluminum oxide, titanium oxide ($TiO_2$), hafnium oxide ($HfO_x$), barium titanate ($BaTiO_3$), or the like. The organic insulating material includes, for example, polyvinylphenol (PVP), polyvinyl alcohol (PVA), polyimide, polyamide, polyester, polyacrylate, polymethacrylate, epoxy resin, benzocuclobutene (BCB), fluorocarbon polymers, photosensitive polyimide, photosensitive novolac resin, poly-paraxylylene, or the like.

To drive the organic TFT at a low voltage, the gate insulating layer 3 is preferably not more than 1 μm thick and preferably has a surface as flat as possible.

The organic semiconductor pattern 4 is made of any one or more kinds of the organic semiconductor materials described below.

The organic semiconductor materials includes, for example, (1) polypyrrole, (2) polythiophene, (3) isothianaphthene such as polyisothianaphthene, (4) thienylene vinylene such as poly-thienylene vinylene, (5) p-phenylene vinylene such as poly(p-phenylene vinylene), (6) polyaniline, (7) polyacetylene, (8) polydiacetylene, (9) polyazulene, or (10) polypyrene.

The organic semiconductor materials includes, for example, (11) polycarbazole, (12) polyselenophene, (13) polyfuran, (14) Poly(p-phenylene), (15) polyindole, (16) polypyridazine, (17) acene such as naphthacene, pentacene, hexacene, heptacene, dibenzopentacene, tetrabenzopentacene, pyrene, dibenzopyrene, chrysene, perylene, coronene, terylene, ovalene, quaterrylene, and circumanthracene, (18) a derivative in which one or more carbons are substituted with an atom such as nitrogen (N), sulfur (S), and oxygen (O), or substituted with a functional group such as carbonyl group, the derivative including triphenodioxazine, triphenodithiazine, hexacene-6,15-quinone, or the like, (19) a polymeric material and a polycyclic condensed product such as polyvinylcarbazole, polyphenylene sulfide, and polyvinylene sulfide, or (20) oligomer having the same repeating units as those of the polymeric material described.

The organic semiconductor materials includes, for example, (21) metallic phthalocyanine such as copper phthalocyanine, (22) tetrathiafulvalene, (23) tetrathiapentalene, (24) naphthalene-1,4,5,8-tetracarboxylic acid diimide, and N,N'-bis(4-trifluoromethylbenzyl)naphthalene-1,4,5,8-tetracarboxylic acid diimide, as well as N,N'-bis(1H,1H-perfluorooctyl)-, N,N'-bis(1H,1H-perfluorobutyl)-, and N,N'-dioctyl naphthalene-1,4,5,8-tetracarboxylic acid diimide derivative, (25) naphthalenetetracarboxylic acid diimide such as naphthalene-2,3,6,7-tetracarboxylic acid diimide, (26) condensed-ring tetracarboxylic acid diimide as typified by a group of anthracene tetracarboxylic acid diimide such as anthracene-2,3,6,7-tetracarboxylic acid diimide, (27) a fullerene such as $C_{60}$, $C_{70}$, $C_{76}$, $C_{78}$, or $C_{84}$, (28) a carbon nanotube such as a single-wall carbon nanotube (SWNT), (29) a pigment such as merocyanine pigment and hemicyanine pigment, or (30) peri-xantheno-xanthene compound such as 2,9-dinanphthyl-peri-xantheno-xanthene.

The organic semiconductor materials may be a derivative of a series of the materials described above. The derivative refers to a material in which one or more substituent groups are introduced to the materials described above, and any kinds of substituent groups may be used and the substituent groups may be introduced to any positions of the materials.

In particular, the organic semiconductor pattern 4 is formed by means of a laser ablation method. More specifically, the organic semiconductor pattern 4 is formed by patterning an organic semiconductor layer 7 formed on the gate insulating layer 3 using the laser ablation method, as described in detail below (refer to FIG. 3).

A fact that the organic semiconductor pattern 4 is formed by the laser ablation method in the completed organic TFT can be confirmed as follows. As for a method of patterning an organic semiconductor layer by a subtractive method, a dry etching method may be used other than the laser ablation method. When the dry etching method is employed, the organic semiconductor layer is patterned under the gas atmosphere such as oxygen ($O_2$), argon (Ar), nitrogen ($N_2$), and hydrogen ($H_2$). Thus, a reactant product as a by-product produced is deposited (attached) on a surface of the organic semiconductor layer. The reactant product is removable by a washing process using an organic solvent, although the organic solvent dissolves a large portion of the organic semiconductor layer easily. Hence, when the dry etching method is employed to pattern the organic semiconductor layer, the washing process using the organic solvent may not be able to be performed. Even if the washing process is performed, it is difficult to continue the washing process until the reactant product is completely removed, and thus the reactant product is remained on the surface of the organic semiconductor layer. In contrast, when the laser ablation method is employed, the reactant product is not produced and thus is not deposited on the surface of the organic semiconductor layer. Therefore, the confirmation as to the fact that the organic semiconductor pattern 4 is formed by the laser ablation method may be made by examining whether the reactant product is not deposited on the surface of the organic semiconductor pattern 4.

The source and the drain electrodes 5 and 6 are preferably made of a material similar to that configuring the gate electrode 2, and are preferably ohmic-contacted to the organic semiconductor pattern 4. Regions where the source electrode 5 and the drain electrode 6 are formed are not limited as long as respective one ends thereof are overlapped on the organic semiconductor pattern 4. In particular, the other ends of the source and the drain electrodes 5 and 6 are preferably extended to a part on the gate insulating layer 3, since this allows the source and the drain electrodes 5 and 6 to contact upper and side faces of the organic semiconductor pattern 4 respectively and thus the area where the source and the drain electrodes 5 and 6 contact with the organic semiconductor pattern 4 becomes large.

[1-2. Method of Manufacturing Thin Film Transistor]

Figure 2:
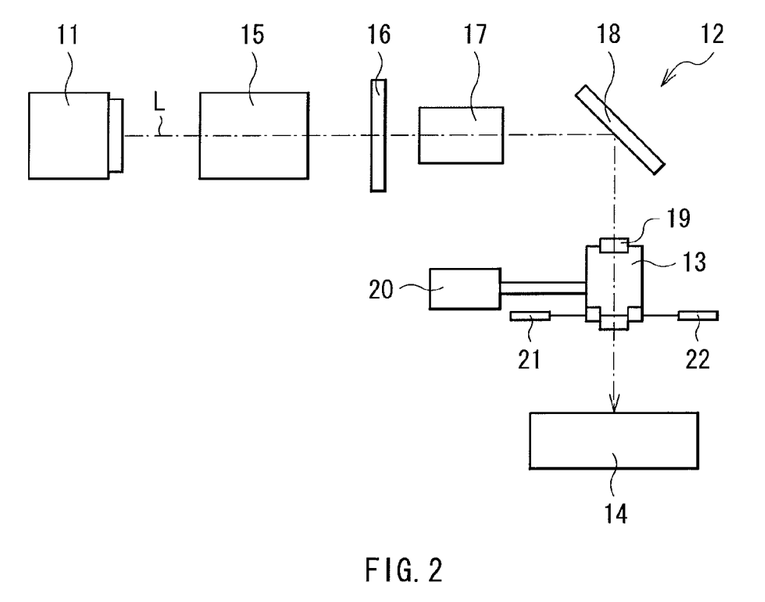
FIG. 2 is a block diagram showing a configuration of a laser beam processing apparatus used for a method of manufacturing the thin film transistor.

The method of manufacturing the organic TFT described above will be described below. FIG. 2 shows the configuration of a laser beam processing apparatus used for the method of manufacturing the organic TFT. FIGS. 3 to 8 are explanatory drawings for describing the method of manufacturing the organic TFT, and each of which shows the cross sectional configuration that corresponds to FIG. 1. The materials configuring the elements of the organic TFT have been described above and are not further described hereafter.

In the following, the configuration of the laser beam processing apparatus will be described first, and the manufacturing method of the organic TFT will then be described. As for manufacturing the organic TFT, a single organic TFT may solely be manufactured or a plurality of organic TFTs may be manufactured collectively (in a parallel processing).

[Configuration of Laser beam processing Apparatus]

The laser beam processing apparatus is used for processing (patterning) that utilizes the laser ablation method. As shown in FIG. 2, the laser beam processing apparatus includes a light source 11, an optical system 12 optically projecting a laser beam L emitted from the light source 11 as a predetermined pattern shape, a debris collecting system 13, and a stage 14, for example. The debris collecting system 13 has a transmission window 19 on the incidence side of the laser beam L, and is connected with an exhaust pump 20 and gas introduction members 21 and 22.

The kind of the light source 11 is, for example but not limited to, the excimer laser. There are several types of laser media (mission wavelength) of the excimer laser, examples of which include XeF (351 nm), XeCl (308 nm), KrF (248 nm), ArF (193 nm), and $F_2$ (157 nm). The kind of the light source 11 may also be a solid-state laser (second to fourth harmonics).

The optical system 12 includes a beam shaping unit 15, a mask 16 (or a variable aperture 16), a projection lens 17, and a mirror 18, all placed in order along the light path of the laser beam L.

The beam shaping unit 15 shapes the laser beam L and uniformizes the intensity of the laser beam L. The mask 16 has an opening with a shape that corresponds to an irradiation shape of the laser beam L. The mask 16 includes, for example, a mask with a hole made of a metal material, a photo-mask made of a glass or a metallic thin film, or a dielectric mask made of a dielectric material. The projection lens 17 projects the laser beam L with a predetermined magnification onto a surface of the stage 14. The mirror 18 reflects the laser beam L and adjusts a direction of irradiation of the laser beam L.

The stage 14 supports an object to be processed. The stage 14 is so positioned that the laser beam L projected by the projection lens 17 is focused on a surface of the object to be processed (a processed surface). The stage 14 is movable within a plane perpendicular to an optical axis of the laser beam L, so as to allow the surface of the object to be processed is scanned by the laser beam L.

The laser beam processing apparatus may be stored in a pressure-adjustable chamber, on an as-needed basis. A pressure when the laser processing is carried out is, for example but not limited to, $10^{-2}$ Pa to 10 Pa.

[Method of Manufacturing Thin Film Transistor]

Figure 3:
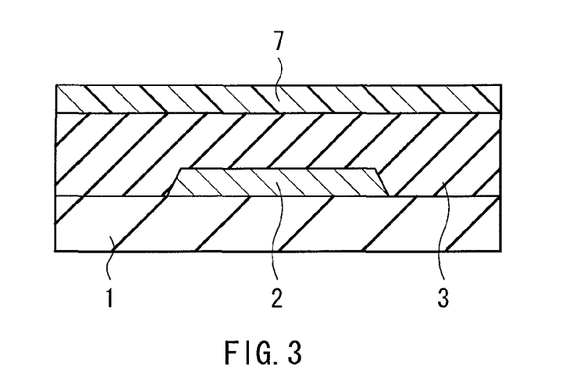
FIG. 3 is a cross-sectional view for describing the method of manufacturing the thin film transistor.

When manufacturing the organic TFT, the support substrate 1 is provided first, following which the gate electrode 2 is patterned on the support substrate 1, as shown in FIG. 3.

To form the gate electrode 2, for example, a metal material layer is so formed as to cover a surface of the support substrate 1, following which the metal material layer is patterned. Examples of a method of forming the metal material layer include a sputtering method, a vacuum deposition method, a plating method, and a coating method using nanoparticles. Examples of a patterning method of the metal material layer include a photolithography method and an etching method. In this case, a resist pattern (not shown) is formed on the metal material layer using the photolithography method, following which the resist pattern is utilized as a mask to etch the metal material layer. The etching method here includes a wet etching method and a dry etching method, for example. Here, etching conditions may be adjusted to allow a width of the gate electrode 2 to be gradually increased as it gets closer to the support substrate 1. After the gate electrode 2 is formed, the resist pattern is removed using a dissolving-washing removal method that utilizes a wet treatment, or using an ashing method, for example.

A forming method of the resist pattern may also be a printing method or a laser drawing method, for example. Examples of the printing method include an inkjet printing method, a flexographic printing method, a gravure printing method, a gravure offset printing method, and an offset printing method. In addition, the inkjet printing method, a screen printing method, a microcontact printing method, the flexographic printing method, the gravure printing method, the gravure offset printing method, or the offset printing method may be employed to directly pattern a metal nanoink.

To form the gate electrode 2, it is desirable that the organic semiconductor pattern 4, formed in a later process step, be insulated enough from the gate electrode 2. Thus, it is preferable that the gate electrode 2 be as thin as possible to achieve good insulation. More specifically, the gate electrode 2 is preferably 200 nm or less in thickness. One reason is that a difference in height (a step) due to the thickness of the gate electrode 2 becomes less, and thereby the gate insulating layer 3 is easily formed to be flat in a later process step.

Then, the gate insulating layer 3 is so formed as to cover the gate electrode 2 and the support substrate 1 around the gate electrode 2.

To form the gate insulating layer 3, for example, an organic insulating material may be dissolved in a solvent such as an organic solvent to prepare the solution, following which the solution is coated using a coating method and is then dried. Thereafter, a heating treatment may be performed on an as-needed basis. Examples of the coating method include a gravure coating method, a roll coating method, a kiss coating method, a knife coating method, a die coating method, a slit coating method, a blade coating method, a spin coating method, and an inkjet method.

Alternatively, an inorganic insulating material may be deposited using a sputtering method or a chemical vapor deposition (CVD) method to form the gate insulating layer 3.

Then, the organic semiconductor layer 7 is formed on the gate insulating layer 3. The organic semiconductor layer 7 is a preparation layer for forming the organic semiconductor pattern 4, and a forming material of the organic semiconductor layer 7 is similar to that of the organic semiconductor pattern 4.

To form the organic semiconductor layer 7, for example, an organic semiconductor material is deposited using a vacuum evaporation method or the like. A resistive-heating evaporation method, a sputtering method, or the like may be used to deposit the organic semiconductor material depending on the kinds of the organic semiconductor material. A coating method such as a spin coating method may also be employed to coat a solution in which the organic semiconductor material is dissolved. Examples of the coating method include a gravure coating method, a roll coating method, a kiss coating method, a knife coating method, a die coating method, a slit coating method, a blade coating method, a spin coating method, and an inkjet method.

Then, the laser beam processing apparatus shown in FIG. 2 is used to pattern the organic semiconductor layer 7 with the laser ablation method.

To pattern the organic semiconductor layer 7, the support substrate 1 on which the organic semiconductor layer 7 is formed is fixed to the stage 14, following which the laser beam L irradiated from the light source 11 is irradiated on the organic semiconductor layer 7. Here, the stage 14 is moved to allow the organic semiconductor layer 7 to be scanned by the laser beam L. The kinds (emission wavelengths) of the light source 11 and process conditions by the laser beam L are optional. The process conditions refer to, for example, the intensity (energy density) of the laser beam L, shaping conditions, and the like.

Figure 4:
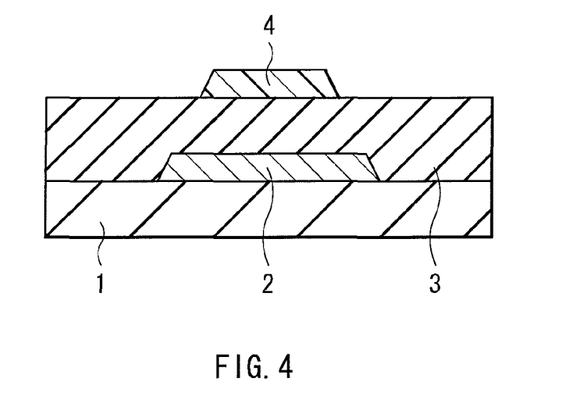
FIG. 4 is a cross-sectional view illustrating a process step subsequent to that shown in FIG. 3.

By the laser beam processing, the organic semiconductor layer 7 is decomposed and removed within the irradiation (scanning) region of the laser beam L, and the organic semiconductor pattern 4 is formed as shown in FIG. 4. This thereby completes the element isolation.

In this case, for example, it is preferable that irradiation conditions of the laser beam L (intensity or the like) be adjusted to increase a width of the organic semiconductor pattern 4 wider on the close side of the gate insulating layer 3 than on the side away from the gate insulating layer 3. One reason is that this makes it easier for the source and the drain electrodes 5 and 6 to contact the organic semiconductor pattern 4 when the source and the drain electrodes 5 and 6 are formed in a later process step. Thereby, gaps (non-contact portion) between the organic semiconductor pattern 4 and the source electrode 5 and between the organic semiconductor pattern 4 and the drain electrode 6 are hardly generated, ensuring electrical continuity therebetween.

The width of the organic semiconductor pattern 4 may increase in a step-by-step fashion, may gradually increase, or may be uniform before it increases, as it gets closer to the gate insulating layer 3. In particular, it is preferable that the width of the organic semiconductor pattern 4 be gradually increased, since this allows side faces of the organic semiconductor pattern 4 to be inclined, thereby making it easier for the source and drain electrodes 5 and 6 to contact the side faces of the organic semiconductor pattern 4.

When patterning the organic semiconductor layer 7 using the laser ablation method, a protection layer (not illustrated) may be formed on the organic semiconductor layer 7 in advance, and the protection layer may simultaneously be patterned with the organic semiconductor layer 7, on an as-needed basis. The protection layer is for preventing an unintentional damage of the organic semiconductor layer 7 in a region other than the irradiation region of the laser beam L, that is, for preventing the organic semiconductor layer 7 to be damaged by the laser beam L, for example. Examples of a forming material of the protection layer include a resin material, a metal material, and an inorganic insulating material. As for an example, the resin material includes a resist or the like, the metal material includes gold, copper, aluminum or the like, and the inorganic insulating material includes silicon oxide, silicon nitride, aluminum oxide, or the like. It is to be noted that, after the formation of the organic semiconductor pattern 4, the protection layer is preferably removed using a method that does not damage the organic semiconductor layer 7.

In the following, a supplemental description will be given on a process step of forming the organic semiconductor pattern 4 using the laser ablation method. The following two methods may be contemplated when a process step of patterning the organic semiconductor layer 7 with the laser ablation method is performed in plural number of times in order to manufacture the plurality of organic TFTs collectively.

Figure 6:
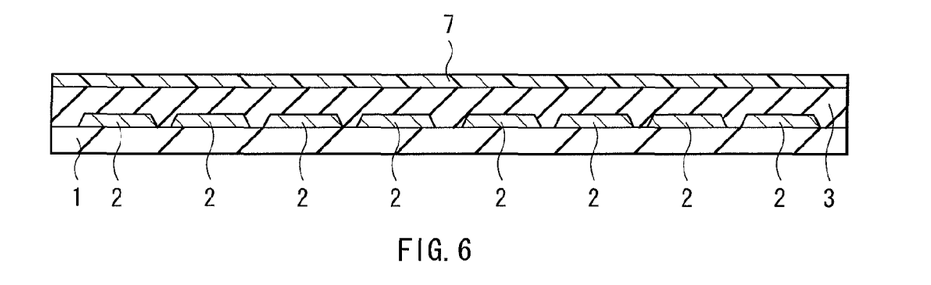
FIG. 6 is a cross-sectional view for supplemental description of the method of manufacturing the thin film transistor.
Figure 7:
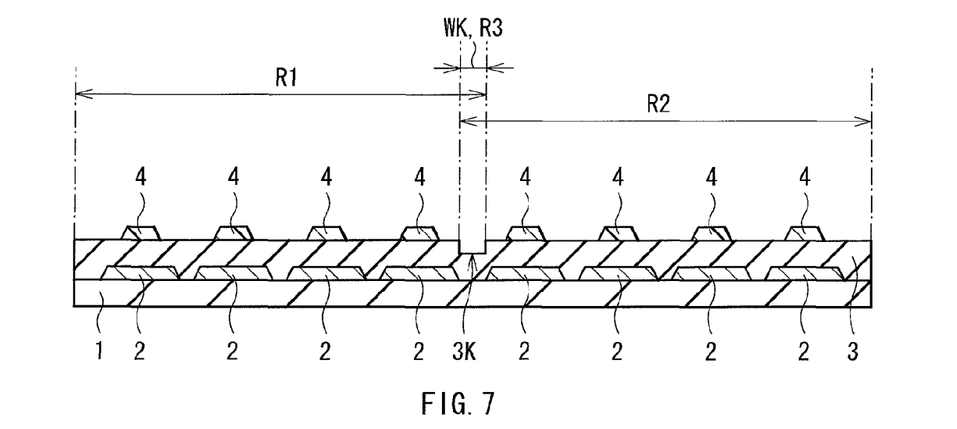
FIG. 7 is a cross-sectional view illustrating a process step subsequent to that shown in FIG. 6.
Figure 8:
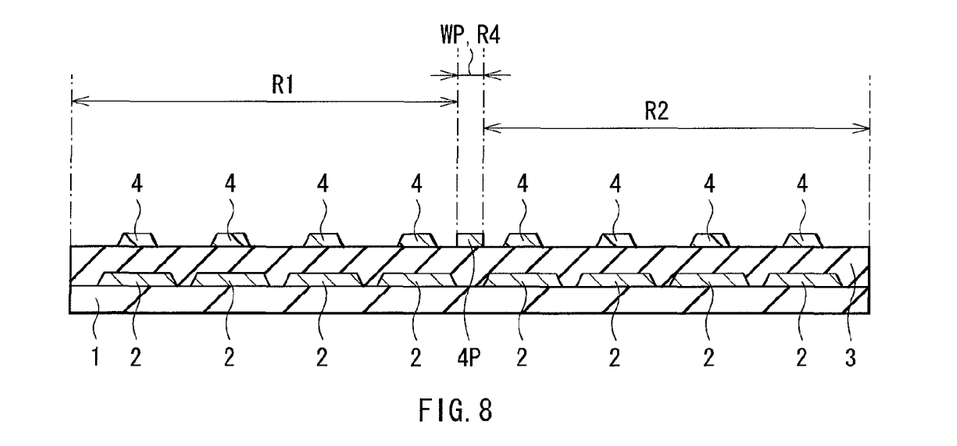
FIG. 8 is a cross-sectional view illustrating another process step subsequent to that shown in FIG. 6.

As shown in FIG. 6, the procedures described above with reference to FIG. 3 is performed to complete the formation up to the organic semiconductor layer 7, except for arranging a plurality of the gate electrodes 2 in an array. Then, the laser beam L is irradiated on irradiation regions R1 and R2 as shown in FIGS. 7 and 8 to form a plurality of the organic semiconductor patterns 4. It is to be noted that, in FIGS. 7 and 8, a spacing between the adjacent gate electrodes 2 is shown narrow for the sake of simplicity in illustration.

In this case, for example, the irradiation regions R1 and R2 may be partially overlapped with each other as shown in FIG. 7. In a region R3 where the irradiation regions R1 and R2 are overlapped with each other, the laser beam L is doubly-irradiated, so that the gate insulating layer 3 is dug down after the organic semiconductor layer 7 is removed. This results in a formation of a depression 3K on the gate insulating layer 3. For this reason, a fact that the depression 3K is formed on the gate insulating layer 3 in the completed organic TFT is evidence proving that the patterning using the laser ablation method has been performed to form the organic semiconductor pattern 4. A width WK of the depression 3K is not particularly limited, but it is preferable that the width WK be as narrow as possible in order to increase the effective-use area of the surface of the support substrate 1. As for an example, the width WK of the depression 3K is preferably 20 μm or less, and more preferably 5 μm or less.

Alternatively, for example, the irradiation regions R1 and R2 may not be overlapped with each other as shown in FIG. 8.

The laser beam L is not irradiated on a region R4 located between the irradiation regions R1 and R2, so that the organic semiconductor layer 7 is not decomposed and removed, and thus remains. Thereby, a redundant pattern 4P made of a material similar to that of the organic semiconductor pattern 4 is formed on the gate insulating layer 3. For this reason, a fact that the redundant pattern 4P is formed in addition to the organic semiconductor pattern 4 in the complete organic TFT is evidence proving that the laser ablation method has been performed to form the organic semiconductor pattern 4. The redundant pattern 4P is clearly distinct from the organic semiconductor pattern 4, since the redundant pattern 4P does not face the gate electrode 2 through the gate insulating layer 3 and is not connected to the source and the drain electrodes 5 and 6. A width WP of the redundant pattern 4P is, for example but not limited to, similar to the width WK of the depression 3K as shown in FIG. 7.

It is to be noted that when there are a plurality of the regions R3 where the irradiation regions R1 and R2 overlap with each other, a plurality of the depressions 3K should also be formed. The same is true for the number of redundant pattern 4P. The foregoing completes the supplemental description on the process step of forming the organic semiconductor pattern 4 using the laser ablation method.

Figure 5:
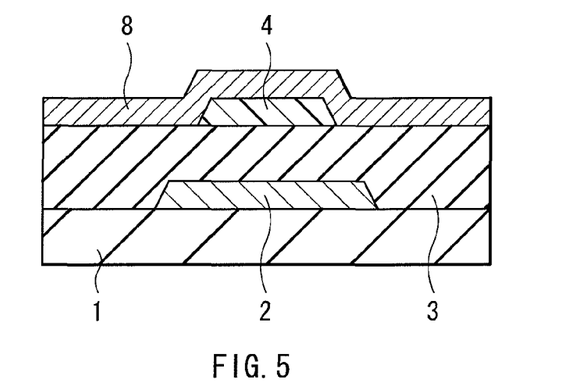
FIG. 5 is a cross-sectional view illustrating a process step subsequent to that shown in FIG. 4.

After the organic semiconductor pattern 4 is formed, an electrode layer 8 is so formed as to cover the organic semiconductor pattern 4 and the gate insulating layer 3 located therearound, as shown in FIG. 5. The electrode layer 8 is a preparation layer for forming the source and the drain electrodes 5 and 6, and a forming material of the electrode layer 8 is similar to that of the source electrode 5 and that of the drain electrode 6.

A forming method of the electrode layer 8 is similar to that of the gate electrode 2, for example. It is preferable that a method that does not damage the organic semiconductor pattern 4 be used, such as preferably a sputtering method.

Finally, the electrode layer 8 is patterned to form the source and the drain electrodes 5 and 6, as shown in FIG. 1.

It is preferable that a patterning method of the electrode layer 8 be a method that does not damage the organic semiconductor pattern 4, such as a wet etching method, for example. In this case, for example, a resist pattern (not shown) is formed on the electrode layer 8 using a photolithography method, following which the resist pattern is used as a mask to wet-etch the electrode layer 8. A forming method and a removing method of the resist pattern are similar to those of forming the gate electrode 2, for example.

The kind of an etching solution used for a wet-etching method is, for example but not limited to, an acid solution, a salt solution, a mixture thereof, or the like. Examples of the acid include a nitric acid, a sulfuric acid, a hydrochloric acid, an acetic acid, an oxalic acid, a fluorinated acid, a hydrogen peroxide solution, and the like. Examples of the salt include ammonium fluoride, potassium iodide, permanganate, bichromate, and the like. When the acid solution is used, the concentration of acid in the etching solution is preferably 20% or less in order to suppress damage on the organic semiconductor pattern 4. The etching solution may contain an additive such as an organic nitrogen compound, in order to ensure a stable etching rate.

Thereby, the source and the drain electrodes 5 and 6 are connected to the organic semiconductor pattern 4, and the organic TFT is thus completed.

[Operation and Effect for Thin Film Transistor and the Method of Manufacturing the Same]

In the organic TFT and the method of manufacturing the same described above, the organic semiconductor layer 7 is patterned using the laser ablation method to form the organic semiconductor pattern 4, following which the source and the drain electrodes 5 and 6 are formed on the organic semiconductor pattern 4. That is, the laser ablation method is used to manufacture the top-contact organic TFT. In this case, the following advantageous effects are achieved.

A first advantageous effect is that, since the laser ablation method is employed as the patterning method of the organic semiconductor layer 7, the organic semiconductor layer 7 is patterned in a short time and with a high precision as compared with a case where a photolithography method and an etching method are used. Also, a necessity of separately forming a mask (such as a resist pattern) used for the patterning is eliminated.

A second advantageous effect is that the source and the drain electrodes 5 and 6 are formed after the organic semiconductor pattern 4 is formed. Thus, the source and the drain electrodes 5 and 6 are not damaged by the laser ablation method. One reason is that, although there is a possibility that the source and the drain electrodes 5 and 6 are unintentionally decomposed and removed by the laser ablation method in a case where the organic semiconductor pattern 4 is formed after the source and the drain electrodes 5 and 6 are formed (a bottom-contact type), the top-contact type does not cause such unintentional decomposition and removal.

A third advantageous effect is that, since the positional relationships between the source electrode 5 and the organic semiconductor pattern 4 and between the drain electrode 6 and the organic semiconductor pattern 4 establish the top-contact type, the contact resistance between the organic semiconductor pattern 4 and the source electrode 5 and that between the organic semiconductor pattern 4 and the drain electrode 6 are reduced, and a heat resistance is improved, as compared with the bottom-contact type.

Therefore, since the top-contact organic TFT, which is low in resistance, is manufactured easily and stably, it is possible to achieve higher performance and easier manufacturing of the organic TFT.

In particular, the bottom-gate organic TFT makes it possible to achieve a high aperture ratio when fabricating a backplane of an electronic device (such as a reflective-type display) having the bottom-gate organic TFT. One reason is that a field-shielded pixel structure is formed in which the drain electrode 6 of the organic TFT and a pixel electrode are connected through an interlayer insulating layer. Further, it is also possible to increase a degree of freedom in the forming material of the organic semiconductor pattern 4. One reason is that a superior surface-flatness of the organic semiconductor pattern 4 is desirable in the top-gate type, and thus the forming material is limited in the top-gate type.

Also, when the width of the organic semiconductor pattern 4 is gradually increased as it gets closer to the gate insulating layer 3 in forming the organic semiconductor pattern 4, the electrical continuity between the source electrode 5 and the organic semiconductor pattern 4 and that between the drain electrode 6 and the organic semiconductor pattern 4 are ensured.

Also, when the wet etching method is employed as the patterning method of the electrode layer 8, the damage on the organic semiconductor pattern 4 by the etching is suppressed unlike a case where the dry etching method is used.

[Modification]

Figure 9:
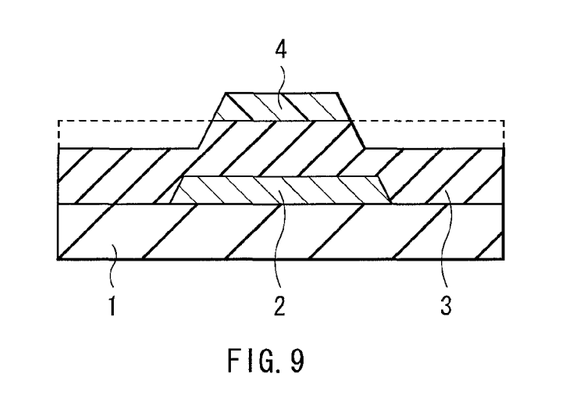
FIG. 9 is a cross-sectional view for describing a modification of the method of manufacturing the thin film transistor.
Figure 10:
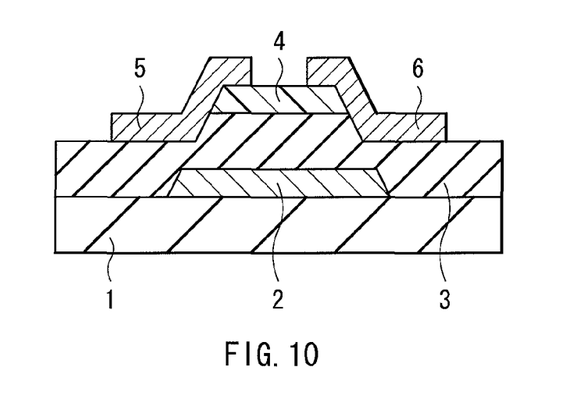
FIG. 10 is a cross-sectional view illustrating a configuration of the thin film transistor manufactured by the process step shown in FIG. 9.

When patterning the organic semiconductor layer 7 using the laser ablation method (FIG. 3), the organic semiconductor pattern 4 may be utilized as a mask to selectively dug down the gate insulating layer 3 up to a depth thereof using the laser ablation method as shown in FIG. 9, for example. When the source and the drain electrodes 5 and 6 are formed thereafter, the organic TFT is manufactured as shown in FIG. 10. This modification also achieves higher performance and easier manufacturing of the organic TFT. Also, this modification makes it further easier for the source and the drain electrodes 5 and 6 to contact the side faces of the organic semiconductor pattern 4, thereby making it possible to further improve the electrical continuity therebetween. It is to be noted that, when the gate insulating layer 3 also serves as an insulating layer for an auxiliary capacitance, it is preferable that a thickness of the gate insulating layer 3 (a thickness of the gate insulating layer 3 in a region in which the gate electrode 2 is not formed) be 200 μm or more, in order to suppress a leakage current.

[2. Application Example of Thin Film Transistor (Electronic Device)]

In the following, an application example of the organic TFT described above will be described. The organic TFT is applicable to various electronic devices. Although the kind of the electronic device is not particularly limited, the organic TFT may be applied to a liquid crystal display device as a display device, for example.

Figures 11, 12:
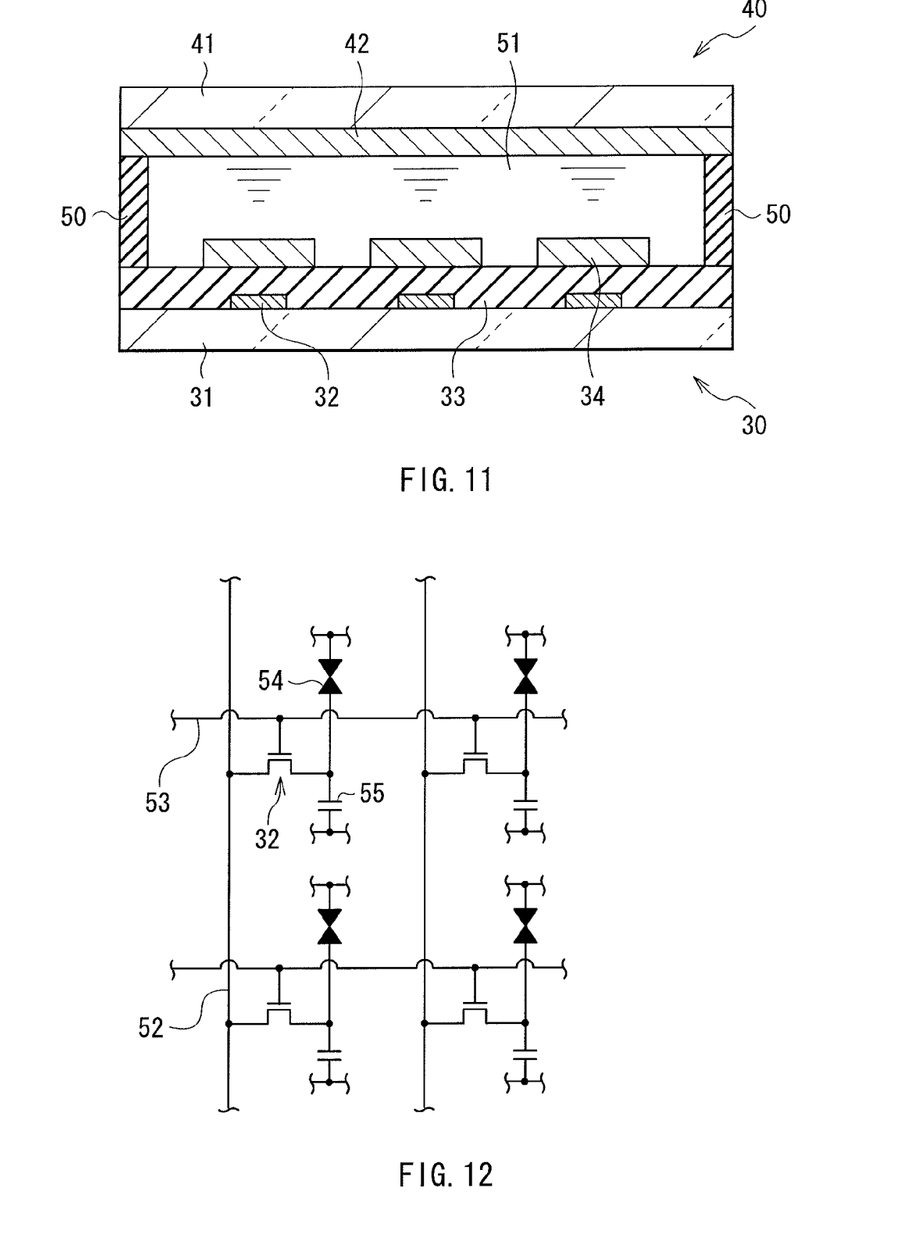
FIG. 11 is a cross-sectional view illustrating a configuration of a major part of a liquid crystal display device which is an application example of the thin film transistor.
FIG. 12 illustrates a circuit configuration of the liquid crystal display device shown in FIG. 11.

FIGS. 11 and 12 show a cross-sectional configuration and a circuit configuration of a main part of the liquid crystal display device, respectively. It is to be noted that a device configuration and the circuit configuration described below are exemplary, and they may be appropriately modified.

[Configuration of the Electronic Device]

The liquid crystal display device described herein is, for example, a transmissive liquid crystal display device of an active matrix drive scheme that utilizes the organic TFT. The organic TFT is used as a switching (pixel selection) element. The liquid crystal display device has a configuration in which a liquid crystal layer 51 is sealed between a drive substrate 30 and a counter substrate 40, as shown in FIG. 11. The liquid crystal display device may be any of a transmissive type and a reflective type.

The drive substrate 30 has a configuration in which, for example, an organic TFT 32, a flattening insulating layer 33, and a pixel electrode 34 are formed in this order on one side of a support substrate 31, and by the organic TFT 32 and the pixel electrode 34 are arranged in matrix.

The support substrate 31 is formed by, for example, a light transmissive material such as a glass material and a plastic material. The organic TFT 32 has a configuration similar to that of the organic TFT described above. The kind of the plastic material is similar to that of the organic TFT described above, for example. The flattening insulating layer 33 is formed by, for example, an insulating resin material such as polyimide or the like. The pixel electrode 34 is formed by, for example, a transmissive conductive material such as ITO (Indium Tin Oxide). The pixel electrode 34 is connected to the organic TFT 32 through a contact hole (not shown) provided in the flattening insulating layer 33.

The counter substrate 40 has a configuration in which a counter electrode 42 is formed throughout the entire one surface of a support substrate 41. The support substrate 41 is formed by, for example, a light transmissive material such as a glass material and a plastic material. The counter electrode 42 is formed by, for example, a transmissive conductive material such as ITO. The kind of the plastic material is similar to that of the organic TFT described above.

The drive substrate 30 and the counter substrate 40 are attached together by a sealing material 50 so that the pixel electrode 34 and the counter electrode 42 are disposed to oppose each other with the liquid crystal layer 51 in between. The kind of liquid crystal molecules included in the liquid crystal layer 51 is optional.

In addition thereto, the liquid crystal display device may include other elements such as, for example, a retardation plate, a polarizing plate, an alignment film, and a backlight unit (each of which are not shown).

A circuit for driving the liquid crystal display device includes, for example, the organic TFT 32, a liquid crystal display element 54 (the pixel electrode 34, the counter electrode 42, and the liquid crystal layer 51), and a capacitor 55 as shown in FIG. 12. In this circuit, a plurality of signal lines 52 are aligned in rows and a plurality of scanning lines 53 are aligned in columns. The organic TFT 32, the liquid crystal display element 54, and the capacitor 55 are disposed at a position at which the signal line and the scanning line intersect with each other. The signal line 52 and the scanning line 53 are connected to a signal line drive circuit (data driver) and a scanning line drive circuit (scanning driver), respectively. Note that a destination of connection of each of the source electrode, the gate electrode, and the drain electrode of the organic TFT 32 is not limited to an example shown in FIG. 12.

[Operation of the Electronic Device]

In the liquid crystal display device, the pixel electrode 34 is selected by the organic TFT 32. When an electric field is applied between that pixel electrode 34 and the counter electrode 42, an alignment state of the liquid crystal layer 51 (liquid crystal molecules) is changed in response to an intensity of the electric field. Thereby, a transmission amount of light (transmittance) is controlled in response to the alignment state of the liquid crystal molecules, by which a gray-scale image is displayed.

[Action and Effect of the Electronic Device]

According to the electronic device, the organic TFT 32 has the configuration similar to that of the organic TFT described above. Thus, the top-contact organic TFT 32, which is low in resistance, is manufactured stably and easily. Therefore, it is possible to achieve higher performance and easier manufacturing of the electronic device.

In particular, use of a flexible material such as a plastic material for the support substrate of the organic TFT 32 makes it possible to achieve a liquid crystal display device which is flexible (bendable).

EXAMPLES

Examples of the embodiment of the present technology will now be described in detail.

Experiment Example 1

A bottom-gate-top-contact type organic TFT was fabricated based on procedures described below.

A metal material layer (gold) was formed on a support substrate (a PES substrate) using a vacuum deposition method, following which the metal material layer was etched using a wet etching method to form a gate electrode. Then, an inorganic insulating material (PVP) and a cross-linking agent (poly(melamine-co-formaldehyde)) were dissolved in propylene glycol monomethyl ether acetate (PGMEA) to prepare a solution, following which the solution was coated and then heated (at 180 degrees centigrade for one hour) to form a gate insulating layer. Then, an organic semiconductor layer (pentacene) was formed at a thickness of 50 nm using a vacuum deposition method. Then, the organic semiconductor layer was patterned by the laser ablation method using the laser processing apparatus shown in FIG. 2 in order to perform the element isolation. Thereby, an organic semiconductor pattern was formed on the gate insulating layer. In this case, KrF (emission wavelength of 248 nm) was employed as a light source (excimer laser). Also, an intensity of the laser beam (an energy density) on a sample surface was in a range from 100 mJ/cm$^2$ to 1000 mJ/cm$^2$. A condition of shaping of the laser beam was so set as to obtain the laser beam having a substantially rectangular shape with a size of 25×25 mm. Finally, a metal material layer (gold) was formed using a vacuum deposition method, following which the metal material layer was etched using a wet etching method (an etching solution: potassium iodide solution) to form a source electrode and a drain electrode.

Experiment Example 2

An organic TFT was fabricated based on procedures similar to those of the experiment example 1, except that a photolithography method and a dry etching method were performed as a method for the element isolation.

Experiment Example 3

An organic TFT was fabricated based on procedures similar to those of the experiment example 1, except that the element isolation was not performed. In this example, a source electrode and a drain electrode were formed on an organic semiconductor layer without forming an organic semiconductor pattern.

The performance of each of the organic TFTs (mobility, ON/OFF ratio, and threshold voltage) under a normal temperature environment (23 degrees centigrade) were examined. The results are shown in Table 1. Here, the threshold voltage is a rising voltage at the time when a correlation between a voltage Vg (V) and a current Id (A) was examined.

TABLE 1

| Example | Element Isolation (Method) | Mobility (cm$^2$/Vs) | ON/OFF ratio | Threshold Voltage (V) |
|---|---|---|---|---|
| 1 | Yes (Laser Ablation Method) | 0.08 | 1 × 10$^6$ | −6 |
| 2 | Yes (Dry Etching Method) | 0.08 | 1 × 10$^6$ | −6 |
| 3 | No (—) | 0.08 | 6 × 10$^3$ | −6 |

The organic TFTs fabricated in the experiment examples 1 to 3 each showed equivalent mobility and threshold voltage irrespective of whether or not the element isolation was performed. However, when the element isolation was performed (experiment examples 1 and 2), the ON/OFF ratio was higher than that of the example where the element isolation was not performed (experiment example 3). In the example where the laser ablation method was used as a method for the element isolation (experiment example 1), the ON/OFF ratio equivalent to that of the example where the dry etching method (experiment example 2) was used was obtained.

These results show that the use of the laser ablation method for the element isolation makes it possible not only to merely perform the element isolation, but also to ensure the ON/OFF ratio which is equivalent to that of a case where a currently-available dry etching method is used. Also, use of the laser ablation method makes it possible to achieve advantageous effects that the patterning of the organic semiconductor layer is performed with high precision in a short time, and that a necessity of forming a mask used for a separate patterning is eliminated. Therefore, use of the laser ablation method is advantageous over the dry etching method in terms of both the performance and the productivity of the organic TFT.

Although the technology has been described in the foregoing by way of example with reference to the embodiment and so forth, the technology is not limited thereto but may be modified in a wide variety of ways. For example, factors such as the forming materials and sizes of the respective elements of the thin film transistor may be appropriately modified.

Also, the electronic device to which the embodiment etc. of the technology is applied may be a display device other than the liquid crystal display device. Examples of such a display device include an organic electroluminescence (EL), an electronic paper display device, and the like. The embodiment etc. of the technology may be applied to an electronic device other than the display device. Examples of such a display device include a digital camera, a laptop personal computer, a mobile phone, a video camera, an ID tag, a sensor, and the like.

The present technology contains subject matter related to that disclosed in Japanese Priority Patent Application JP 2010-120176 filed in the Japan Patent office on May 26, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a thin film transistor comprising:
    forming a gate electrode on a substrate;
    forming a gate insulating layer on the gate electrode;
    forming an organic semiconductor layer on the gate insulating layer;
    forming an organic semiconductor pattern by selectively removing part of the organic semiconductor layer by means of a laser ablation method, the gate insulating layer being selectively dug down up to a depth thereof using the organic semiconductor pattern as a mask in the laser ablation method; and
    forming source and drain electrodes on the organic semiconductor pattern.

2. The method of manufacturing the thin film transistor according to claim 1, wherein the organic semiconductor pattern is formed to increase in width when approaching the gate insulating layer.

3. The method of manufacturing the thin film transistor according to claim 1, wherein an electrode layer is formed on the organic semiconductor pattern, and then part of the electrode layer is selectively removed by means of a wet etching method, to form the source and drain electrodes.

4. The method of manufacturing the thin film transistor according to claim 1, wherein the method is used to manufacture a top-contact type organic thin film transistor.

5. The method of manufacturing the thin film transistor according to claim 1, wherein:
    the organic semiconductor pattern is formed such that organic semiconductor pattern has a lower surface facing the gate insulating layer, an upper surface facing away from the gate insulating layer surface, and two side surfaces,
    the source electrode is formed on the organic semiconductor pattern such that the source electrode contacts one side surface and a first portion of the upper surface of the organic semiconductor pattern, and
    the drain electrode is formed on the organic semiconductor pattern such that the drain electrode contacts another side surface and a second portion of the upper surface of the organic semiconductor pattern.

6. The method of manufacturing the thin film transistor according to claim 1, wherein a part of the source electrode and a part of the drain electrode are formed on the dug down gate insulating layer.

\* \* \* \* \*